United States Patent
McLaughlin et al.

(10) Patent No.: US 11,538,654 B2
(45) Date of Patent: Dec. 27, 2022

(54) THERMALLY ISOLATED CAPTIVE FEATURES FOR ION IMPLANTATION SYSTEMS

(71) Applicant: Applied Materials, Inc., Santa Clara, CA (US)

(72) Inventors: Adam M. McLaughlin, Merrimac, MA (US); Jordan B. Tye, Arlington, MA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/410,251

(22) Filed: Aug. 24, 2021

(65) Prior Publication Data

US 2021/0384004 A1    Dec. 9, 2021

Related U.S. Application Data

(62) Division of application No. 16/826,921, filed on Mar. 23, 2020, now Pat. No. 11,127,558.

(51) Int. Cl.
*H01J 37/08* (2006.01)
*H01J 37/20* (2006.01)
(Continued)

(52) U.S. Cl.
CPC ............ *H01J 37/08* (2013.01); *C23C 14/48* (2013.01); *H01J 37/20* (2013.01);
(Continued)

(58) Field of Classification Search
None
See application file for complete search history.

(56) References Cited

U.S. PATENT DOCUMENTS

| 5,262,652 A | 11/1993 | Bright et al. |
| 5,497,005 A | 3/1996 | Medulla et al. |

(Continued)

FOREIGN PATENT DOCUMENTS

| CN | 108140524 A | 6/2018 |
| JP | 2018-519649 A | 7/2018 |

(Continued)

OTHER PUBLICATIONS

International Search Report and Written Opinion dated Dec. 24, 2020 in co-pending PCT application No. PCT/US2020/046625.

(Continued)

*Primary Examiner* — Andrew Smyth
(74) *Attorney, Agent, or Firm* — Nields, Lemack & Frame, LLC (57) ABSTRACT

Thermally isolated captive features disposed in various components of an ion implantation system are disclosed. Electrodes, such as repellers and side electrodes, may be constructed with a captive feature, which serves as the electrode stem. The electrode stem makes minimal physical contact with the electrode mass due to a gap disposed in the interior cavity which retains the flared head of the electrode stem. In this way, the temperature of the electrode mass may remain higher than would otherwise be possible as conduction is reduced. Further, this concept can be applied to workpiece holders. For example, a ceramic platen is manufactured with one or more captive fasteners which are used to affix the platen to a base. This may minimize the thermal conduction between the platen and the base, while providing an improved mechanical connection.

8 Claims, 10 Drawing Sheets

(51) Int. Cl.
*H01J 37/317* (2006.01)
*H01L 21/687* (2006.01)
*C23C 14/48* (2006.01)

(52) U.S. Cl.
CPC .... *H01J 37/3171* (2013.01); *H01L 21/68757* (2013.01); *H01J 2237/061* (2013.01)

(56) References Cited

U.S. PATENT DOCUMENTS

| | | | |
|---|---|---|---|
| 8,702,920 B2* | 4/2014 | Ikejiri | H01J 27/022 |
| | | | 204/298.12 |
| 9,299,529 B2* | 3/2016 | Tanjo | H01J 37/3171 |
| 9,530,615 B2 | 12/2016 | Kurunczi et al. | |
| 9,633,824 B2 | 4/2017 | Nguyen et al. | |
| 9,711,316 B2 | 7/2017 | Leavitt et al. | |
| 9,818,570 B2 | 11/2017 | Alvarado et al. | |
| 9,824,846 B2* | 11/2017 | Lee | H01J 27/022 |
| 10,854,416 B1 | 12/2020 | McLaughlin et al. | |
| 11,127,558 B1 | 9/2021 | McLaughlin et al. | |
| 2004/0149927 A1 | 8/2004 | Iwasawa | |
| 2006/0163489 A1 | 7/2006 | Low et al. | |
| 2008/0230713 A1 | 9/2008 | Huang et al. | |
| 2009/0242793 A1* | 10/2009 | Low | H01J 37/16 |
| | | | 250/424 |
| 2010/0051825 A1 | 3/2010 | Yamashita et al. | |
| 2011/0139613 A1* | 6/2011 | Ikejiri | H01J 27/022 |
| | | | 204/298.12 |
| 2012/0255490 A1* | 10/2012 | Tanjo | H01J 27/02 |
| | | | 118/638 |
| 2014/0265856 A1 | 9/2014 | Hahto et al. | |
| 2015/0034837 A1 | 2/2015 | Koo et al. | |
| 2015/0179385 A1 | 6/2015 | Sato et al. | |
| 2017/0117113 A1 | 4/2017 | Alvarado et al. | |
| 2017/0133193 A1 | 5/2017 | Colvin et al. | |
| 2017/0213684 A1 | 7/2017 | Lee et al. | |
| 2017/0221669 A1 | 8/2017 | Chaney et al. | |
| 2017/0287579 A1 | 10/2017 | Colvin et al. | |
| 2018/0226218 A1 | 8/2018 | Hwang | |
| 2019/0139742 A1 | 5/2019 | McLaughlin et al. | |
| 2021/0074503 A1 | 3/2021 | McLaughlin et al. | |
| 2021/0296077 A1 | 9/2021 | McLaughlin et al. | |

FOREIGN PATENT DOCUMENTS

| | | |
|---|---|---|
| KR | 10-1726189 B1 | 4/2017 |
| TW | 201435955 A | 9/2014 |
| TW | 201526067 A | 7/2015 |
| WO | 2017/079588 A1 | 5/2017 |
| WO | 2017/176675 A1 | 10/2017 |

OTHER PUBLICATIONS

International Search Report and Written Opinion dated Jun. 24, 2021 in corresponding PCT application No. PCT/US2021/021052.
Notice of Allowance dated Oct. 21, 2021 in co-pending U.S. Appl. No. 17/078,262.

* cited by examiner

THERMALLY ISOLATED CAPTIVE FEATURES FOR ION IMPLANTATION SYSTEMS

This application is a divisional of U.S. patent application Ser. No. 16/826,921 filed Mar. 23, 2020, the disclosure of which is incorporated herein by reference in its entirety.

FIELD

Embodiments of the present disclosure relate to thermally isolated captive features, and more particularly, captive features for use in high temperature applications using ion implantation systems.

BACKGROUND

Various types of ion sources may be used to create the ions that are used in semiconductor processing equipment. For example, Freeman ion sources operate by supplying a current to a filament that passes from one end of the chamber to the opposite end. A Bernas ion source and a Calutron ion source operate by supplying a current to a filament that is disposed near one end of the chamber. In each of these sources, the filament emits thermionic electrons that are emitted into the chamber. These electrons collide with the feed gas to create a plasma.

Another type of ion source is the indirectly heated cathode (IHC) ion source. IHC ion sources operate by supplying a current to a filament disposed behind a cathode. The filament emits thermionic electrons, which are accelerated toward and heat the cathode, in turn causing the cathode to emit electrons into the chamber of the ion source. Since the filament is protected by the cathode, its life may be extended relative to a Bernas ion source. The cathode is disposed at one end of a chamber. A repeller is typically disposed on the end of the chamber opposite the cathode. The cathode and repeller may be biased so as to repel the electrons, directing them back toward the center of the chamber. In some embodiments, a magnetic field is used to further confine the electrons within the chamber.

In certain embodiments of these ion sources, side electrodes are also disposed on one or more walls of the chamber. These side electrodes may be positively or negatively biased so as to control the position of ions and electrons, so as to increase the ion density near the center of the chamber. An extraction aperture is disposed along another side, proximate the center of the chamber, through which the ions may be extracted.

When generating ions, the species of the desired ions may influence the optimal temperature. For example, for certain species, it may be preferably to maintain the ion source at a relatively low temperature. In other embodiments, such as the ionization of carbon-based species, a higher temperature may be desirable to minimize deposition within the chamber.

Maintaining a high temperature within the chamber may be problematic. While the temperature of the components within the arc chamber are often controlled by the amount of power dissipated by the filament, the temperature of each component is limited by the amount of thermal radiation emitted and the amount of conduction that draws heat away from these components through mating components. For example, the repeller and the electrodes may be physically attached to clamps located external to the ion source that are used to hold them in place. These clamps may be constructed from metal and may be affixed to a cooler component, such as the arc chamber base. This thermal path creates a thermal draw away from the repeller and the electrodes that cause them to operate at a lower temperature than desired.

Further, the workpiece being processed may be disposed on a platen. In certain embodiments, it may be beneficial to maintain the platen at an elevated temperature. However, the platen is often in communication with a large base, which is often cooled and which draws the heat away from the platen. Furthermore, locations where hot and cold components meet may experience a high stress concentration, which may lead to failure.

Therefore, a system that minimizes thermal conduction between parts within an ion implantation system may be beneficial. This may reduce the power to maintain a component at an elevated temperature and reduce temperature gradients, which allows a more robust design. Further, it would be advantageous if the system also allows for mechanical connection between these parts. In this way, the parts may be mechanically attached with reduced thermal conduction.

SUMMARY

Thermally isolated captive features disposed in various components of an ion implantation system are disclosed. Electrodes, such as repellers and side electrodes, may be constructed with a captive feature, which serves as the electrode stem. The electrode stem makes minimal physical contact with the electrode mass due to a gap disposed in the interior cavity which retains the flared head of the electrode stem. In this way, the temperature of the electrode mass may remain higher than would otherwise be possible as conduction is reduced. Further, this concept can be applied to workpiece holders. For example, a ceramic platen is manufactured with one or more captive fasteners which are used to affix the platen to a base. This may minimize the thermal conduction between the platen and the base, while providing an improved mechanical connection. In both cases, the captive features are under high vacuum, meaning that there is no gas in the gap between the objects being connected. The lack of gas between the two components eliminates heat transfer through convection.

According to one embodiment, an electrode for use in an ion source is disclosed. The electrode comprises an electrode mass adapted to be disposed within the ion source, having an interior cavity in communication with an exterior of the electrode mass through an opening; and an electrode stem, having a post and a flared head, wherein the flared head is disposed in the interior cavity and a size of the flared head is such that it cannot pass through the opening. In certain embodiments, the electrode comprises a repeller. In certain embodiments, the flared head comprises a disk. In certain embodiments, the flared head comprises a plurality of spokes. In certain embodiments, the flared head comprises a dome shape, a reversed dome shape, a ball a tapered cone or a square. In some embodiments, the cross-sectional area of the electrode stem is reduced along its length. In some embodiments, the electrode comprises a keying feature such that the electrode stem and the electrode mass cannot rotate relative to one another.

According to another embodiment, a workpiece holder for use in an ion implantation system is disclosed. The workpiece holder comprises a platen, having an interior cavity in communication with an exterior of the platen through an opening; and a captive fastener, having a shaft and a flared head, wherein the flared head is disposed in the interior cavity and a size of the flared head is such that it cannot pass through the opening. In certain embodiments, a protruding ring is disposed on the shaft to set a spacing between the platen and a base. In some embodiments, the platen and the captive fastener are constructed of ceramic. In certain embodiments, the captive fastener exits the interior cavity perpendicular to a surface of the platen. In some embodiments, the workpiece holder comprises a base, the base having a through hole, through which the shaft of the captive fastener passes and further comprises a retaining nut to affix the shaft to the base. In certain embodiments, the workpiece holder comprises spacers surrounding the captive fastener to maintain a separation between the platen and the base. In some embodiments, the captive fastener exits the interior cavity at an angle relative to a surface of the platen, wherein the angle is not perpendicular. In some embodiments, the flared head comprises a cylinder.

According to another embodiment, a semiconductor processing system is disclosed. The semiconductor processing system comprises an ion source; and a component, wherein the component comprises: a body having an interior cavity in communication with an exterior of the body through an opening; and a captive fastener, having a flared head, wherein the flared head is disposed in the interior cavity and a size of the flared head is such that it cannot pass through the opening. In certain embodiments, the component comprises a mounting wall or a chamber wall. In certain further embodiments, the semiconductor processing system comprises a liner and a mating fastener, wherein the liner is held proximate the mounting wall or the chamber wall by attaching the mating fastener to the captive fastener. In another embodiment, the component comprises a liner. In certain further embodiments, the semiconductor processing system comprises a wall having a threaded hole, wherein the liner is held proximate the wall by screwing the captive fastener into the threaded hole.

BRIEF DESCRIPTION OF THE FIGURES

For a better understanding of the present disclosure, reference is made to the accompanying drawings, which are incorporated herein by reference and in which.

DETAILED DESCRIPTION

As described above, it may be beneficial to operate ion sources, such as indirectly heated cathode (IHC) ion sources, at elevated temperatures in certain situations. However, the repeller and electrodes conduct a significant amount of heat away from the chamber. The present disclosure describes a new repeller and electrode design that minimizes this loss of heat.

Figure 1:
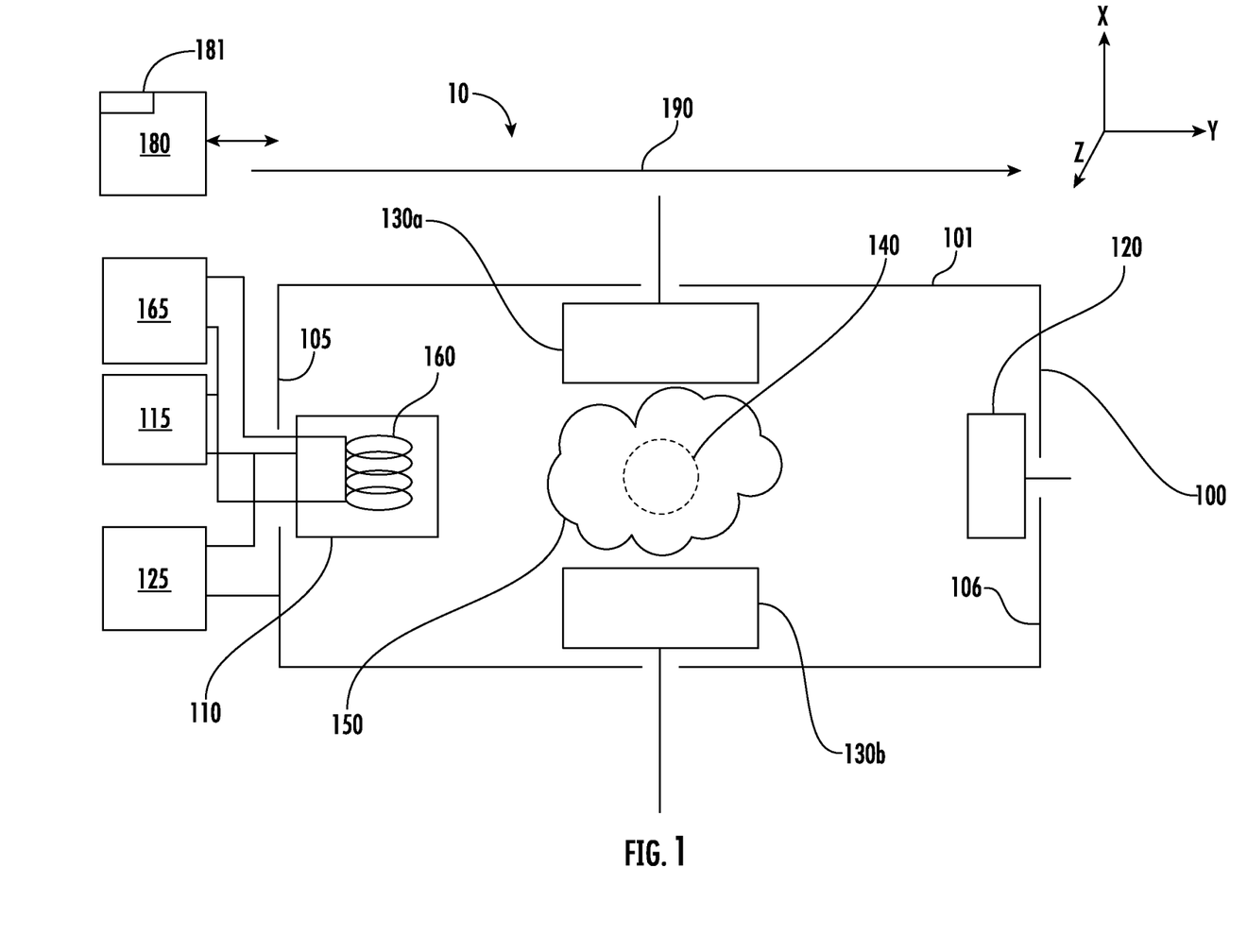
FIG. 1 is an ion source that may utilize the repeller and electrode design described herein in accordance with one embodiment.
Figure 2:
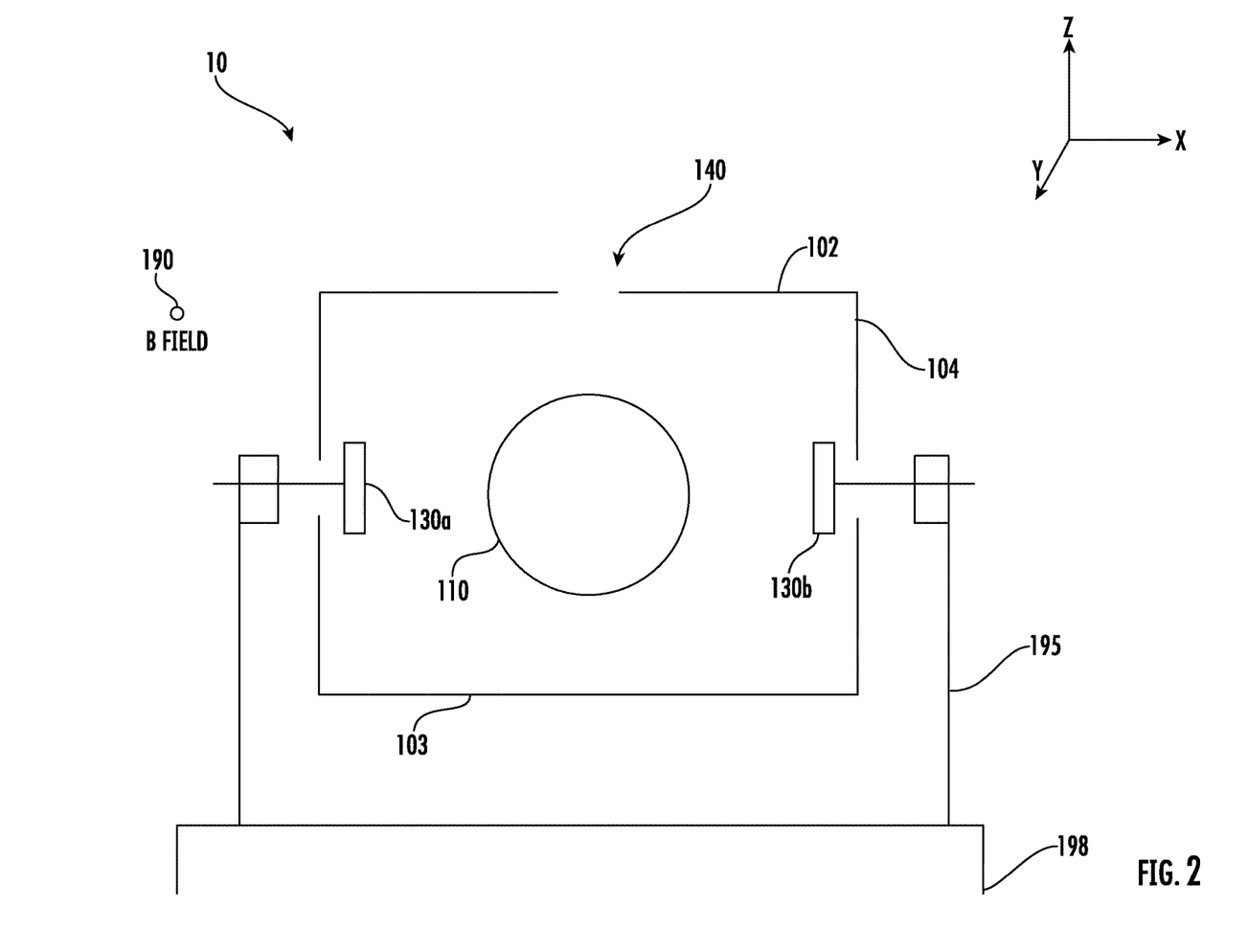
FIG. 2 is a cross-sectional view of the ion source of FIG. 1.

FIG. 1 shows an ion source 10 that includes a repeller 120 and side electrodes 130a, 130b that overcome these issues. FIG. 2 shows a cross-section of the ion source of FIG. 1. The ion source 10 may be an indirectly heated cathode (IHC) ion source. The ion source 10 includes a chamber 100, comprising two opposite ends, and walls 101 connecting to these ends. These walls 101 include side walls 104, an extraction plate 102 and a bottom wall 103 opposite the extraction plate 102. The walls 101 of the chamber 100 may be constructed of an electrically conductive material and may be in electrical communication with one another. A cathode 110 is disposed in the chamber 100 at a first end 105 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Filament bias power supply 115 biases filament 160 negatively relative to the cathode 110, so these thermionic electrons are accelerated from the filament 160 toward the cathode 110 and heat the cathode 110 when they strike the back surface of cathode 110. The filament bias power supply 115 may bias the filament 160 so that it has a voltage that is between, for example, 200V to 1500V more negative than the voltage of the cathode 110. The cathode 110 then emits thermionic electrons on its front surface into chamber 100.

Thus, the filament power supply 165 supplies a current to the filament 160. The filament bias power supply 115 biases the filament 160 so that it is more negative than the cathode 110, so that electrons are attracted toward the cathode 110 from the filament 160. In certain embodiments, the cathode 110 is also in communication with a cathode bias supply 125. In other embodiments, the cathode 110 may be grounded. In certain embodiments, the chamber 100 is connected to electrical ground. In certain embodiments, the walls 101 provide the ground reference for the other power supplies.

In this embodiment, a repeller 120 is disposed in the chamber 100 on the second end 106 of the chamber 100 opposite the cathode 110. As the name suggests, the repeller 120 serves to repel the electrons emitted from the cathode 110 back toward the center of the chamber 100. For example, in certain embodiments, the repeller 120 may be in communication with a power supply. In other embodiments, the repeller 120 may be floated relative to the chamber 100. In other words, when floated, the repeller 120 is not electrically connected to a power supply or to the chamber 100. In this embodiment, the voltage of the repeller 120 tends to drift to a voltage close to that of the cathode 110.

In certain embodiments, a magnetic field 190 is generated in the chamber 100. This magnetic field is intended to confine the electrons along one direction. The magnetic field 190 typically runs parallel to the side walls 104 from the first end 105 to the second end 106. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

In the embodiment shown in FIG. 1, first side electrode 130*a* and second side electrode 130*b* may be disposed on side walls 104 of the chamber 100, such that the side electrodes are within the chamber 100. The side electrodes may each be floated or in communication with a power supply. FIG. 2 shows a cross-sectional view of the ion source 10 of FIG. 1. In this figure, the cathode 110 is shown against the first end 105 of the ion source 10. First side electrode 130*a* and second side electrode 130*b* are shown on opposite walls 101 of the chamber 100. The magnetic field 190 is shown directed out of the page, in the Y direction. In certain embodiments, the electrodes may be separated from the walls 101 of the chamber 100 through the use of insulators.

Each of the cathode 110, the repeller 120, the first side electrode 130*a* and the second side electrode 130*b* is made of an electrically conductive material, such as a metal. Each of these components may be physically separated from the walls 101.

Disposed on the extraction plate 102, may be an extraction aperture 140. In FIG. 1, the extraction aperture 140 is disposed on a side that is parallel to the X-Y plane (parallel to the page). Further, while not shown, the ion source 10 also comprises a gas inlet through which the gas to be ionized is introduced to the chamber 100.

A controller 180 may be in communication with one or more of the power supplies such that the voltage or current supplied by these power supplies may be modified. The controller 180 may include a processing unit 181, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

In operation, electrons are emitted by the cathode 110. These electrons may be constrained by the magnetic and electrical fields within the chamber 100 so as to collide with the feed gas to create a plasma 150. Electrodes outside the chamber 100 may be used to extract ions from the plasma 150 through the extraction aperture 140.

As described above, in certain embodiments, it is advantageous to operate the ion source at elevated temperatures. These elevated temperatures may help prevent the deposition of material on the components within the chamber 100. For example, when ionizing carbon-based species, the carbon tends to accumulate on interior surfaces, the repeller 120 and the side electrodes 130*a*, 130*b*. One way to minimize this deposition is to increase the temperature within the chamber 100 and particularly, the temperatures of the repeller 120 and the side electrodes 130*a*, 130*b*.

As noted above, the repeller 120 and the side electrodes 130*a*, 130*b* may be attached to external clamps 195 (see FIG. 2) that are supported by the chamber base 198, which may be at a lower temperature, such as less than 400° C. However, it may be desirable to maintain the repeller 120 and the side electrodes 130*a*, 130*b* at temperatures closer to the temperature within the chamber 100, which may be 600° C. or more.

Figure 3:
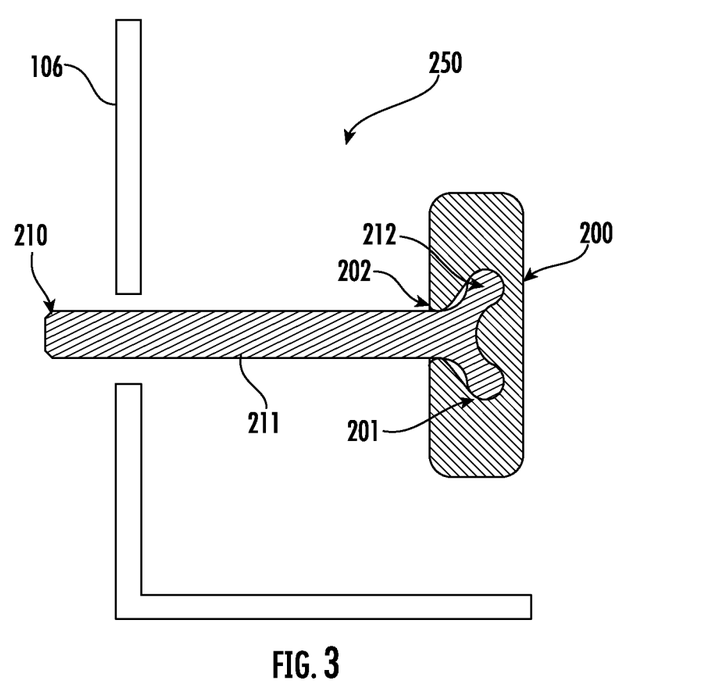
FIG. 3 is a cross-sectional view of the repeller in accordance with an embodiment.

Repeller 120 and/or side electrodes 130*a*, 130*b* may be formed with a thermally isolated captive feature. FIG. 3 shows an embodiment of an electrode that utilizes a thermally isolated captive feature. The term "electrode" is used to encompass both the repeller 120 and the side electrodes 130*a*, 130*b*.

The electrode 250 may comprise an electrode mass 200 and an electrode stem 210. The electrode mass 200 may be disk-shaped, rectangular or any other suitable shape. An interior cavity 201 is disposed in the electrode mass 200. The interior cavity 201 is in communication with the exterior of the electrode mass 200 via an opening 202.

The electrode stem 210 may have a post 211 and a flared head 212. The post 211 may be a straight cylindrical rod. The flared head 212 is disposed within the interior cavity 201 of the electrode mass 200. The electrode stem 210 is sized such that the cross-sectional area of the post 211 is smaller than the cross-sectional area of the opening 202. Additionally, the flared head 212 is sized that the cross-sectional area of the flared head 212 is larger than the cross-sectional area of the opening 202. In this way, the electrode stem 210 is captively held by the electrode mass 200. In certain embodiments, the gap between the flared head 212 and the interior cavity 201 may be 0.001", but may be larger or smaller than this value.

Further, in certain embodiments, the volume of the interior cavity 201 is larger than the volume of the flared head 212 such that there is a gap between the flared head 212 and the electrode mass 200 at most locations. The internal geometry of the interior cavity 201 may be any shape, as long as the opening 202 presents the electrode stem 210 from detaching from the electrode mass 200.

In certain embodiments, the electrode 250 may be created through the use of additive manufacturing technologies. Additive manufacturing techniques allows a component to be manufactured differently. Rather than removing material as is traditionally done, additive manufacturing techniques create the component in a layer by layer fashion. One such additive manufacturing technique is known as Direct Metal Laser Sintering (DMLS) uses a powder bed and a laser. A thin layer of powder is applied to a workpiece space. A laser is used to sinter the powder, only in the areas where the component to be formed. The remainder of the metal powder remains and forms a powder bed. After the laser process is completed, another thin layer of metal powder is applied on top of the existing powder bed. The laser is again used to sinter specific locations. This process may be repeated an arbitrary number of times.

While DMLS is one technique, there are many others. For example, metal binder jetting is similar to DMLS, except that rather than using a laser to sinter the powder, a liquid binder to applied to the areas from which the component is to be formed. Another example of additive manufacturing is electron beam printing. In this embodiment, a thin filament of metal is extruded from a nozzle and a laser or electron beam is used to melt the metal as it is extruded. In this embodiment, the metal is only applied to those areas that are to become part of the component. Of course, other types of additive manufacturing, such as fused filament fabrication directed energy deposition, sheet lamination, Powder Bed Fusion, Material Extrusion, and Vat Photopolymerization may also be employed.

Using additive manufacturing, the electrode 250 may be printed/grown all at once so that the electrode stem 210 is truly captive inside of the electrode mass 200, and does not need any assembly. Depending upon the manufacturing process, the electrode 250 may be cleaned to remove powder trapped within the small gap between the electrode mass 200 and the electrode stem 210.

Figure 4A:
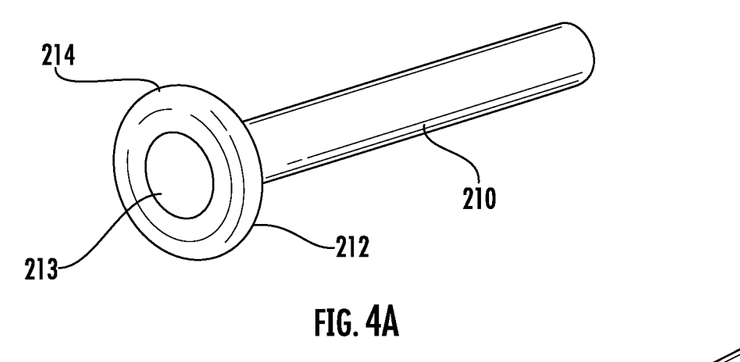
FIG. 4A is a perspective view of the stem according to one embodiment.

FIG. 4A shows a perspective view of the electrode stem 210 according to one embodiment. In this embodiment, the flared head 212 is in the shape of a disk 213. The outer diameter of this disk 213 is greater than the diameter of opening 202, which keeps the electrode stem 210 captive. In certain embodiments, the disk 213 may also be concave wherein the disk 213 extends outward and away from the electrode stem 210. In other embodiments, the disk 213 may be planar such that it only extends outward from the electrode stem 210. Further, in certain embodiments, the disk 213 may have an enlarged rim 214 on its outer circumference.

Figure 4B:
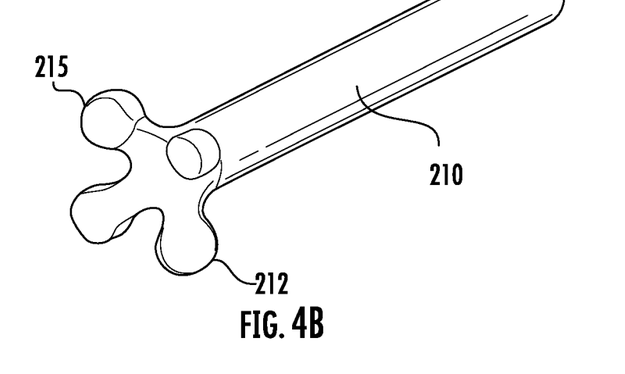
FIG. 4B is a perspective view of the stem according to another embodiment.

FIG. 4B shows a perspective view of the electrode stem 210 according to a second embodiment. In this embodiment, the flared head 212 comprises a plurality of spokes 215. While FIG. 4B shows four spokes 215, the number of spokes 215 is not limited by this disclosure. In certain embodiments, the spokes 215 extend outward and away from the electrode stem 210. In other embodiments, the spokes may be planar and only extend outward from the electrode stem 210. Each spoke may have a width of 0.1 inches, although other dimensions are also possible.

FIGS. 5A-5E show other configurations where the electrode stem 210 has a flared head 212 so as to remain captive with the interior cavity 201 of the electrode mass 200.

Figure 5A:
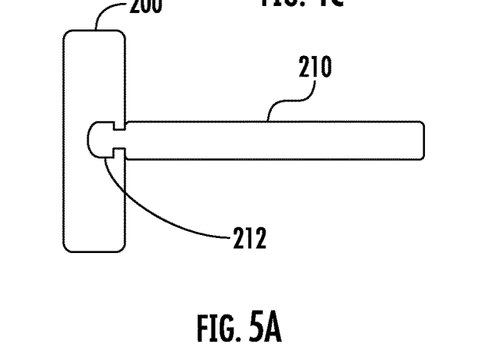
FIGS. 5A-5E show various configurations for the electrode.

FIG. 5A shows an electrode stem 210 where the flared head 212 is dome-shaped.

Figure 5B:
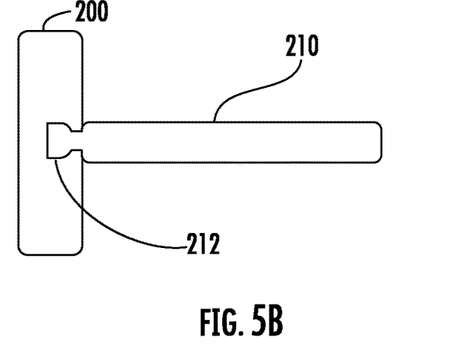

FIG. 5B shows an electrode stem 210 where the flared head 212 is a reversed dome shape.

Figure 5C:
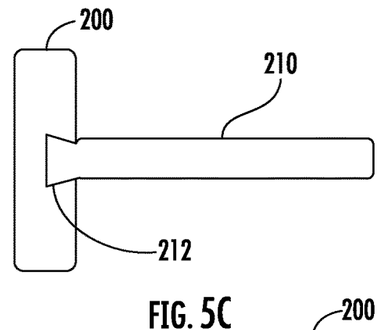

FIG. 5C shows an electrode stem 210 where the flared head 212 is tapered in a conical shape.

Figure 5D:
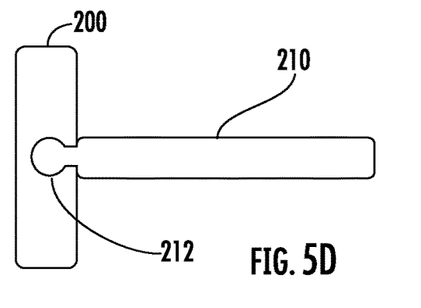

FIG. 5D shows an electrode stem 210 where the flared head 212 is a ball.

Figure 5E:
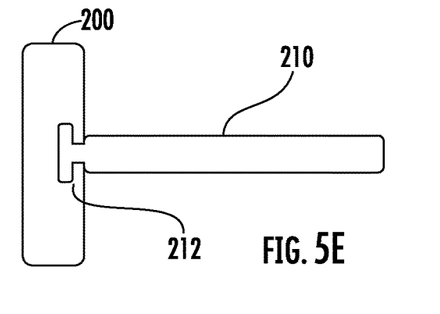

FIG. 5E shows an electrode stem 210 where the flared head 212 is a square block. This has a benefit in that the electrode mass 200 and electrode stem 210 cannot rotate with respect to each other.

Figure 6:
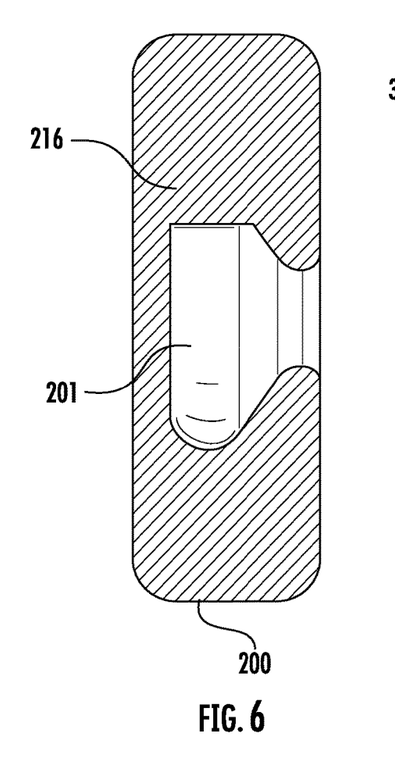
FIG. 6 shows a keying feature.

However, the other embodiments can all be modified so as to inhibit relative rotation between the electrode stem 210 and the electrode mass 200. For example, a keying feature 216 may be added to the interior cavity 201 and/or the flared head 212. FIG. 6 shows an embodiment where one portion of the interior cavity 201 is truncated. The flared head 212 would be similarly truncated so that these components cannot rotate relative to each other.

In all of these embodiments, the electrode stem 210 makes minimal physical contact with the electrode mass 200 when assembled in the chamber 100 under vacuum conditions. For example, the physical contact may be limited to locations along only a portion of the outer edge of the flared head 212 where gravity forces the electrode mass 200 downward. Because of this, there is very little thermal conduction between the electrode mass 200 and the electrode stem 210. Thus, a large temperature difference may exist between the electrode mass 200 and the electrode stem 210.

Figure 4C:
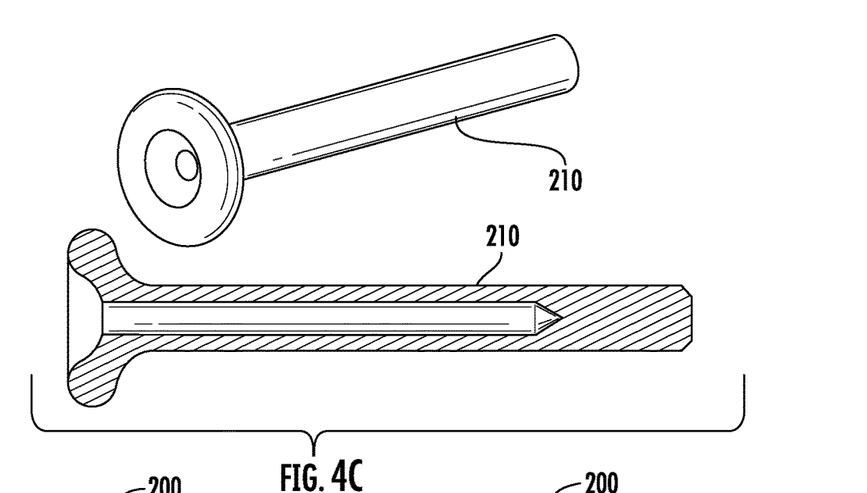
FIG. 4C is a cross-sectional view and a perspective view of the stem according to another embodiment.

The thermal conduction of the electrode stem 210 may be further reduced by reducing the cross-sectional area of the electrode stem 210. For example, as shown in FIG. 4C, an electrode stem 210 similar to that in FIG. 4A is shown. However, in this embodiment, a portion of the electrode stem 210 may be hollow. In other embodiments, the cross-sectional area of the electrode stem 210 may be reduced in one or more locations.

It is noted that FIGS. 3-6 describe an electrode mass 200 and a captive electrode stem 210. This structure may be applied to repeller 120 and side electrodes 130a, 130b. In these embodiments, the shape of the side electrode mass may differ from that of the repeller mass. However, the structure and function of the interior cavity 201, the opening 202, and the flared head 212 is as explained above.

Figure 7A:
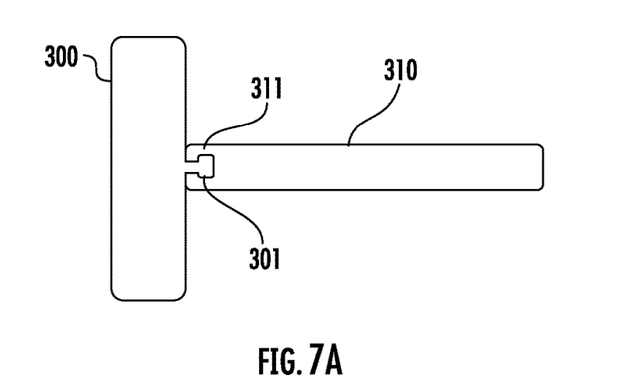
FIGS. 7A-7B show two configurations for the electrode.

In certain embodiments, the electrode stem 210 is held captive using a different mechanism. For example, as shown in FIG. 7A, the electrode mass 300 has a flared protrusion 301. The electrode stem 310 in this embodiment has an interior cavity 311 that holds the flared protrusion 301 captive. In this embodiment, the flared protrusion 301 may be any desired shape, such as those shown in FIGS. 4A-4B and 5A-5E.

Figure 7B:
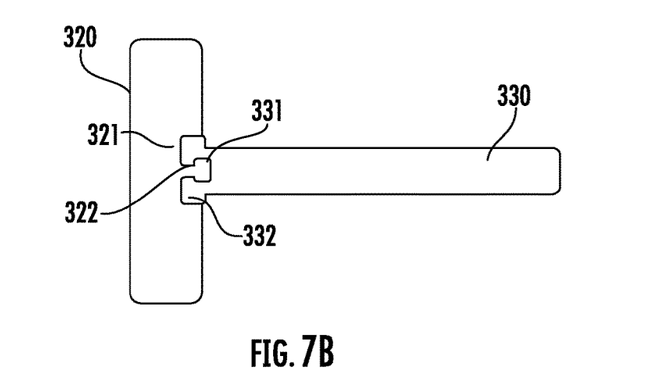

FIG. 7B shows an embodiment where the electrode mass 320 has an interior cavity 321 with a flared protrusion 322 disposed in that interior cavity 321. The electrode stem 330 has an interior cavity 331 that holds the flared protrusion 322 captive and also has a flared head 332 that is held captive in the interior cavity 321.

Figures 8A, 8B:
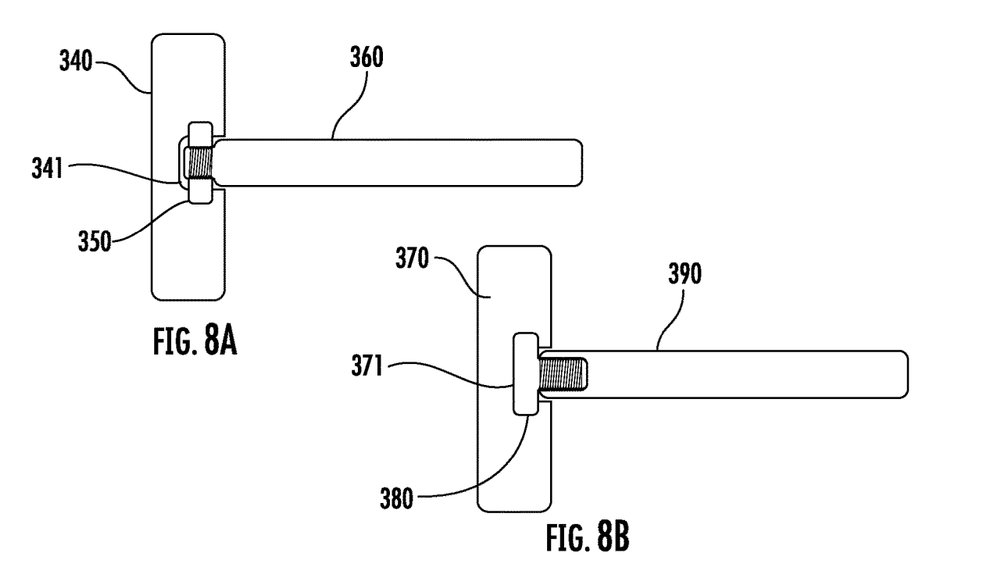
FIGS. 8A-8B show two configurations for the electrode.

In certain embodiments, the entirety of the electrode stem is not captive. For example, as shown in FIG. 8A, the electrode mass 340 has an interior cavity 341, similar to that described above. However, rather than holding the entire electrode stem captive, a nut 350 is held captive in the interior cavity 341. An electrode stem 360 having a threaded end is then screwed into the nut 350. This embodiment may simplify the design of the electrode mass 340.

FIG. 8B shows another embodiment where the entirety of the electrode stem is not held captive. The electrode mass 370 has an interior cavity 371, similar to that described above. However, rather than holding the entire electrode stem captive, a threaded stud 380 is held captive in the interior cavity 371. An electrode stem 390 having a threaded opening is then screwed into the threaded stud 380.

Thus, in some embodiments, the electrode mass is fabricated with a captive feature. A captive feature is one which cannot be detached from the electrode mass because the flared head cannot pass through the opening. However, the captive feature is separate from the electrode mass such that thermal conduction is reduced or eliminated. In many embodiments, such as those shown in FIGS. 4A-4C, 5A-5E and 6A-7B, the captive feature is the entirety of the electrode stem. In other embodiments, such as those shown in FIGS. 8A-8B, the captive feature is a component to which the electrode stem can be attached.

In many applications, the electrode is utilized in a high vacuum environment. In this environment, there is no convection between the electrode mass and the electrode stem. Thus, any heat transfer is only the result of radiation and conduction.

Figure 9A:
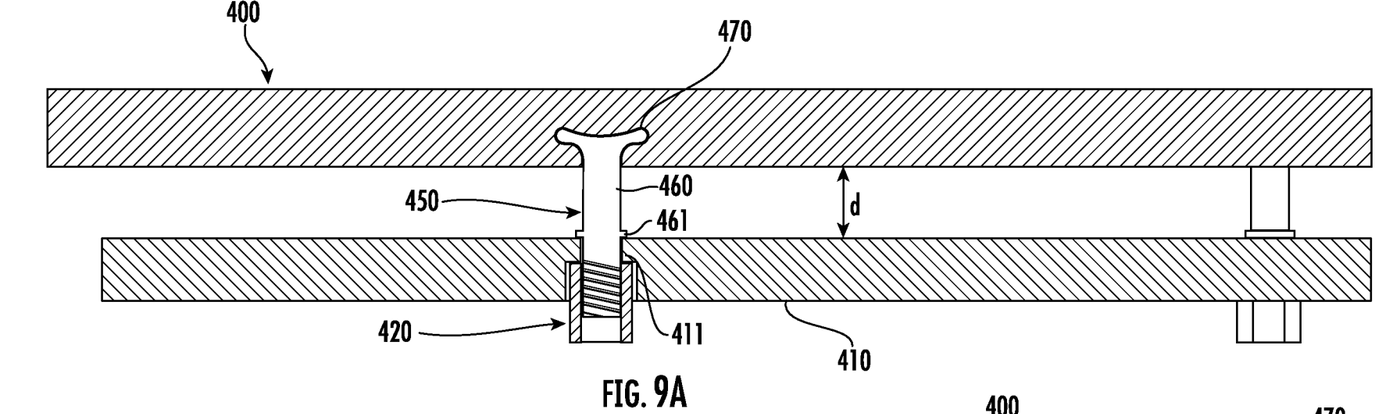
FIGS. 9A-9B show a workpiece holder according to one embodiment.

The concept of thermally isolated captive features may be employed in other areas within an ion implantation system. For example, FIG. 9A shows a workpiece holder that comprises a platen 400 disposed on a base 410. The platen 400 may be separated from the base 410 by a predetermined spacing "d". In certain embodiments, it may be advantageous to maintain the platen 400 at an elevated temperature. However, the base 410 is typically made from a metal, such as aluminum and thus acts as a heat sink. However, a mechanical attachment mechanism is used to attach the platen 400 to the base 410. This mechanical attachment mechanism may be a source of thermal conduction between the platen 400 and the base 410.

Figure 9B:
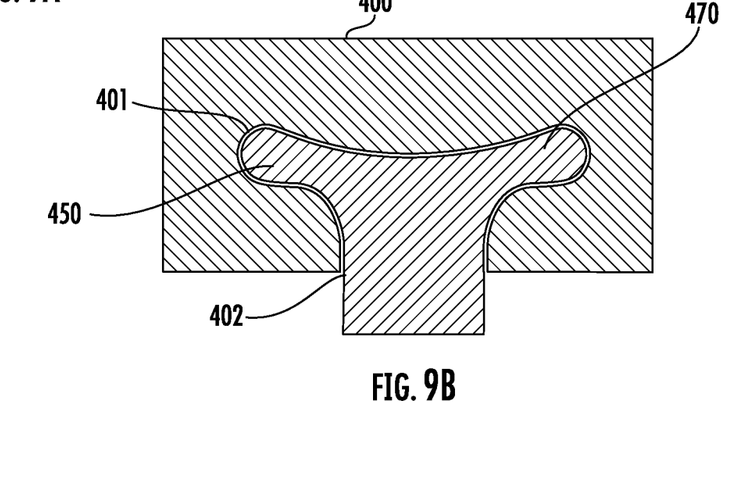

In this embodiment, the mechanical attachment mechanism is a captive fastener 450, that is thermally isolated from the platen 400. As best seen in FIG. 9B, the captive fastener 450 may be disposed within an interior cavity 401 of the platen 400. The interior cavity 401 is in communication with the exterior of the platen 400 via an opening 402. The captive fastener 450 and the opening 402 are sized so that the captive fastener 450 cannot be separated from the platen 400. In certain embodiments, the gap between the captive fastener 450 and the interior cavity 401 may be in the range of 0.001 inches, although this gap can be larger or smaller depending on the implementation. The platen 400 may be constructed of a ceramic material.

Since the captive fastener 450 cannot be separated from the platen 400, the platen 400 and the captive fastener 450 are manufactured as one assembly. Specifically, a mixture of ceramic powder and binding agent is deposited, using additive manufacturing. In most regions, as this mixture creates the single piece ceramic platen after sintering. In those regions which are to be left void or empty, such as the vacant portion of the interior cavity 401, only one of the ceramic powder and the binding agent is deposited. The deposition of material is used to maintain the integrity of the platen 400 during the additive manufacturing process. However, since only one of the ceramic powder and the binding agent is deposited, this region will not become hardened after sintering. In this way, the captive fastener 450 may be contained within an interior cavity 401 of the platen 400, without being physically attached thereto. The deposition process is repeated for each layer until the entire platen 400 and captive fastener 450 has been printed. After all of the material needed to form the platen 400 and the captive fastener 450 has been deposited, the assembly is placed in a furnace, where the assembly is sintered. After sintering, the platen 400 and the captive fastener 450 have become hardened ceramic. However, the void regions do not become hardened. In the embodiment where only ceramic powder is deposited in the void regions, the ceramic powder may remain in powder form after sintering. In this embodiment, the interior cavity 401 may need to be cleaned. This may be achieved by introducing pressurized air or another fluid in the interior cavity 401. In another embodiment, a vacuum may be applied to the interior cavity 401 to draw the powder. In the embodiment where only binding agent is deposited in the void regions, the binding agent may evaporate during the sintering process, leaving air gaps in the platen 400. In this embodiment, a cleaning process may not be performed.

Binder jetting is but one method to create the ceramic. However, other methods are also possible. Material jetting or stereo lithography are also methods used to make additively manufactured ceramic parts. In these cases, a photosensitive resin is cured by UV light. The gap is still maintained between parts but would be filled with uncured resin (SLA) or a support material (material jetting). In these cases, removal of support/uncured material would be done.

The captive fastener 450 may comprise a shaft 460, which is threaded along at least a portion of its length. The shaft 460 terminates in a flared head 470. The flared head may be constructed similar to those shown in FIGS. 4A-4B or 5A-5E. The flared head 470 is disposed in the interior cavity 401 of the platen 400. The captive fastener 450 is made of the same material as the platen 400. A protruding ring 461 may be disposed along the shaft 460. The location of the protruding ring 461 is used to create a predetermined spacing "d" between the platen 400 and the base 410.

The captive fastener 450 may be inserted into an opening 411 in the base 410. In one embodiment, the opening 411 may be a through hole and a retaining nut 420 may be used to secure the captive fastener 450 to the base 410.

While FIG. 9A shows two captive fasteners 450, the number of captive fasteners 450 is not limited by this disclosure.

Figure 10:
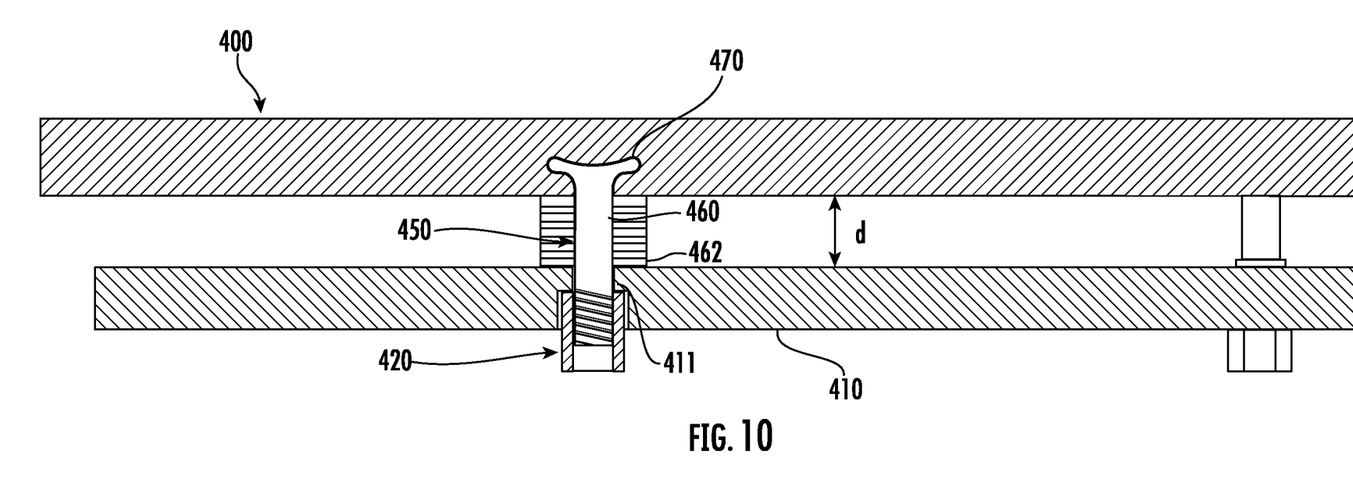
FIG. 10 shows a workpiece holder with thermal spacers.

Further, as shown in FIG. 10, in other embodiments, rather than having a protruding ring 461, thermal spacers 462 may be disposed around the captive fastener 450 to maintain the desired separation between the platen 400 and the base 410. The thermal spacers 462 may be washers that surround the captive fastener 450.

Additionally, while FIGS. 9A-9B and 10 show the captive fasteners 450 oriented perpendicular to the surface of the base 410, other embodiments are also possible.

FIGS. 11A-11D show another embodiment that utilizes captive fasteners 550 to attach the platen 500 to the base 510. In this embodiment, the captive fasteners 550 comprise a shaft 560, which is threaded along at least a portion of its length. The shaft terminates in a flared head 570. In this embodiment, the flared head 570 is in the shape of a cylinder, although other shapes, such as those shown in FIGS. 3-6, may be used. As before, the platen 500 has an interior cavity 501 which communicates with the exterior through an opening 502. The flared head 570 and the opening 502 are sized so that the captive fastener 550 cannot be separated from the platen 500. In this embodiment, the opening 502 is elongated to allow the captive fastener 550 to rotate within the platen 500. Likewise, the openings 511 in the base 510 are also elongated.

Figure 11A:
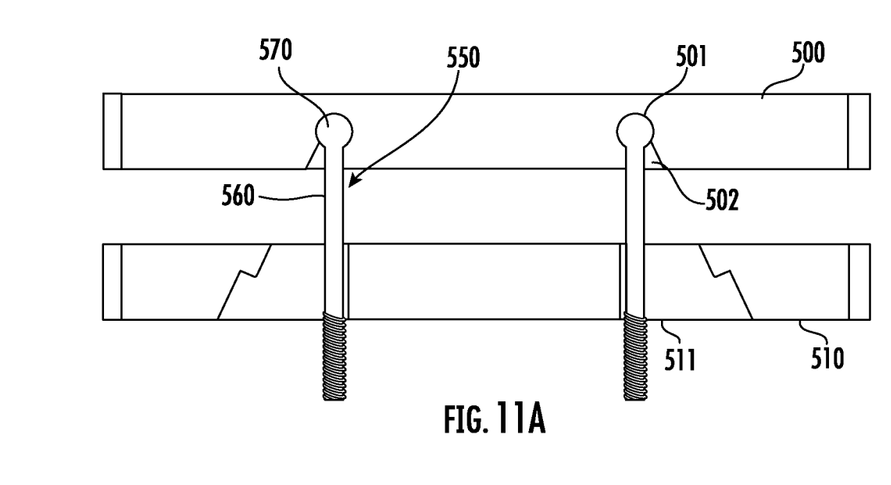
FIGS. 11A-11D show a workpiece holder according to another embodiment.
Figure 11B:
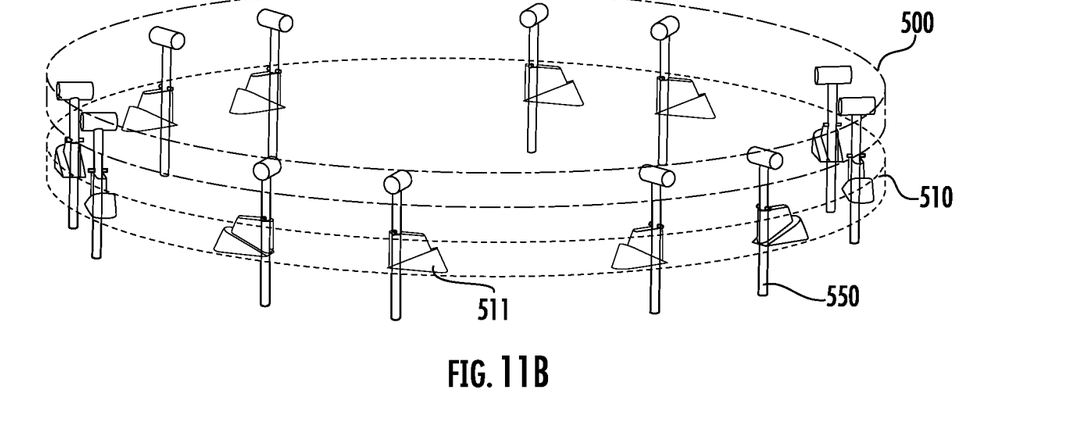

As shown in FIG. 11B, the captive fasteners 550 are inserted into corresponding openings 511 in the base 510. This may be performed by aligning the platen 500 and the base 510 such that the captive fasteners 550 extend from the openings 502 perpendicular to the surface of the base 510. The captive fasteners 550 then pass through the openings 511 in the base 510.

Figure 11C:
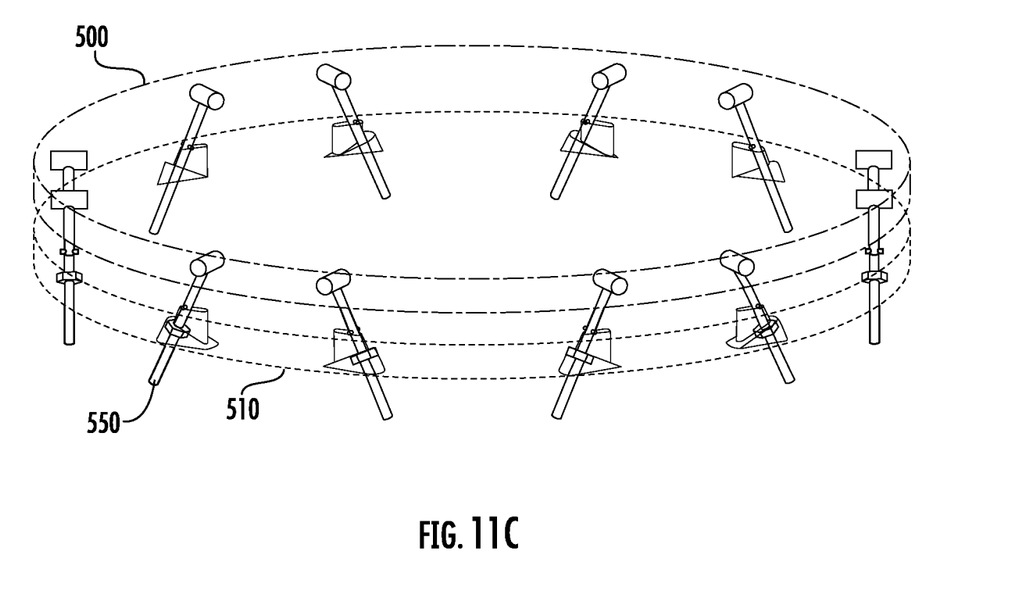
Figure 11D:
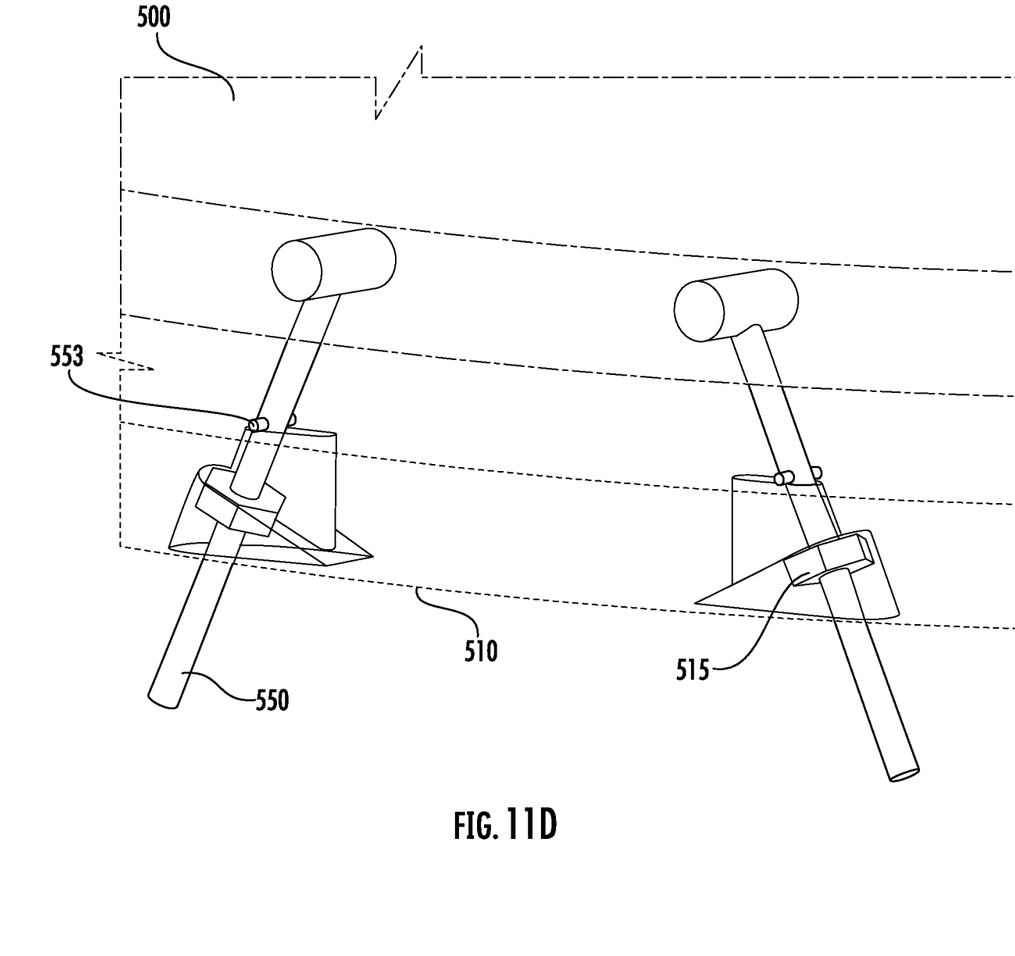

Once the captive fasteners 550 are inserted in the openings 511 in the base 510, the captive fasteners 550 may be rotated at an angle relative to the surface of the platen 500, as shown in FIG. 11C. This angle is different from perpendicular and may be between 25 and 65 degrees, although other angles are possible. This angle allows the platen 500 to be held to the base 510 in two directions, which may produce a more robust connection. The captive fasteners 550 may be attached to the base 510 using the retaining nuts 515, as shown in FIG. 11D. Further, protruding rings 553 may be used to limit the movement of the captive fasteners 550.

Thus, the present disclosure describes a body, such as an electrode mass or a platen, that includes a captive fastener, where the physical contact between the captive fastener and the body is minimized. This allows the mass to remain at its desired temperature, and limits the amount of thermal conduction between the body and the captive fastener. While the above disclosure describes this with respect to electrodes and platens, there are other components within a semiconductor processing system that may benefit from this arrangement. These components include liners that are disposed in ion sources. The captive fasteners may be used to hold the liners in place, while minimizing thermal conduction between the liners and the ion source chamber wall.

Figure 12A:
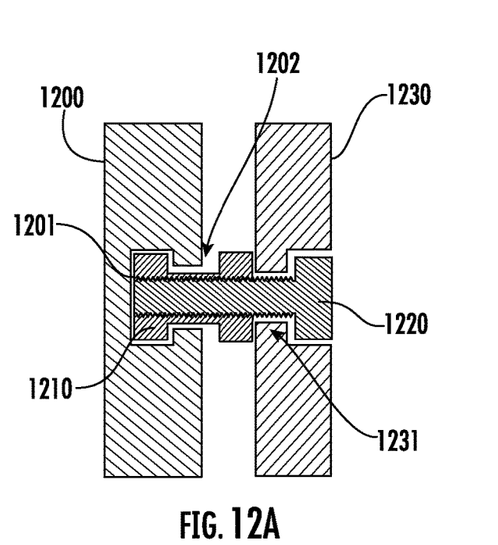
FIGS. 12A-12C show a chamber wall and a liner according to different embodiments.
Figure 12B:
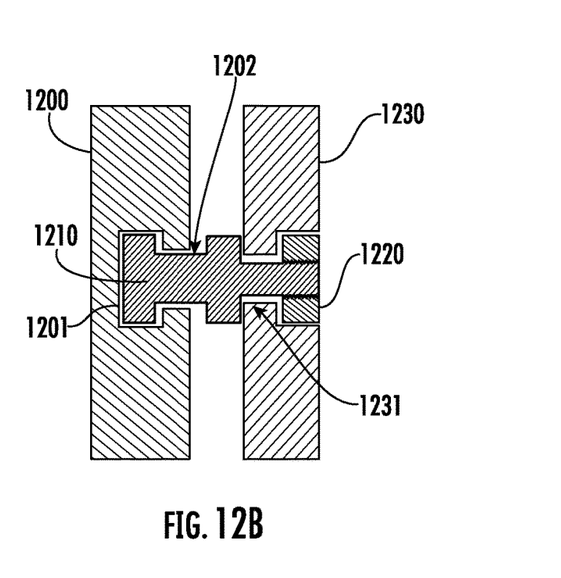
Figure 12C:
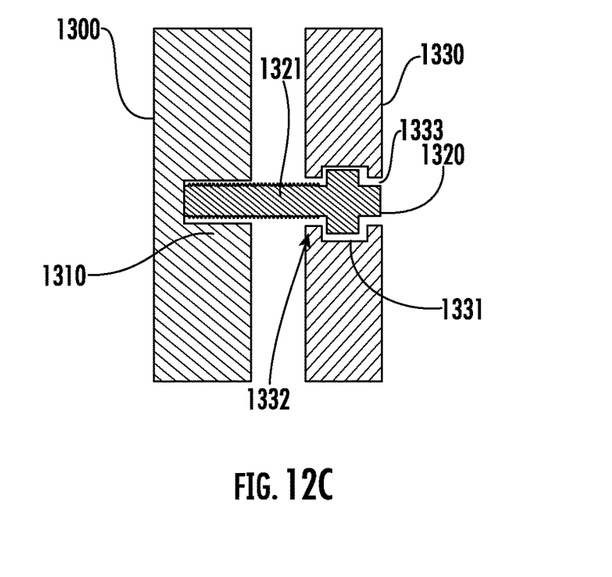

FIGS. 12A-12C show various embodiments that may be used to attach a liner to a wall, such as a chamber wall or a mounting wall. The wall may be an interior wall of an ion source chamber; an interior wall of a mass analyzer, an interior surface of a scanner; an interior surface of a collimator magnet, or another suitable location.

In FIGS. 12A-12B, the wall 1200 includes a captive fastener 1210. The wall 1200 may be a conductive material, such as a metal or another suitable material. In these embodiments, a liner 1230 is disposed proximate the wall 1200, such as to protect the wall 1200 from ion strikes. However, it may beneficial for there to be limited thermal conductivity between the wall 1200 and the liner 1230. As described above, the wall 1200 includes an interior cavity 1201 holding the captive fastener, where the interior cavity 1201 is in communication with the exterior of the wall through an opening 1202. The captive fastener has a flared head sized such that the flared head cannot be extracted through the opening 1202.

A mating fastener 1220 is disposed on the side of the liner 1230 opposite the wall 1200. In certain embodiments, the liner 1230 include a through hole 1231. The captive fastener 1210 or the mating fastener 1220 passes through the through hole 1231. When the captive fastener 1210 and the mating fastener 1220 are attached, a gap remains between the wall 1200 and the liner 1230. Furthermore, as described above, there is minimal thermal conductivity between the wall 1200 and the captive fastener 1210.

In FIG. 12A, the captive fastener 1210 is a nut, while the mating fastener 1220 is a screw or threaded bolt. In FIG. 12B, the captive fastener 1210 is a screw or threaded bolt and the mating fastener 1220 is a nut.

In FIGS. 12A-12B, the captive fastener may have a spacer feature to insure that the wall 1200 and the liner 1230 are not in physical contact.

FIG. 12C shows another embodiment. In this embodiment, the liner 1330 includes the captive fastener 1320 held in an interior cavity 1331. In this embodiment, the interior cavity is in communication with an exterior of the liner 1330 via openings 1332, 1333 on both sides of the liner 1330. The captive fastener 1320 comprises a screw having a flared head and a threaded shaft 1321. The flared head cannot pass through either opening. The threaded shaft 1321 passes through opening 1332. The wall 1300 includes a threaded hole 1310. The captive fastener 1320 may be screwed into the threaded hole 1310. In certain embodiments, the opening 1333 allows a tool, such as a screwdriver to be inserted into the interior cavity 1331 to assemble the liner 1330 and the wall 1300. The length of the threaded shaft 1321 is such that when fully inserted into the threaded hole 1310, the liner 1330 remains separated from the wall 1300.

Of course, other components within a semiconductor processing system may also be created having a captive fastener. These include electrodes in the acceleration/deceleration stage, electrodes in the extraction optics, or other suitable locations.

The embodiments described above in the present application may have many advantages. With respect to the electrode design, there is very limited thermal conduction due to the limited physical contact between the electrode stem and the electrode mass. Rather, most heat transfer will occur via radiation, which is typically very low due to the fact that the electrode is typically operated in vacuum conditions. Thus, the electrode mass may remain at a much higher temperature than is achieved with conventional electrodes. This may be beneficial for processes involving carbon, which tends to be deposited on any component in the arc chamber that is at a temperature less than about 800° C. Further, it is possible that other methods traditionally used to add heat to the arc chamber, such as by resistive heaters, radiation shielding and others, may be eliminated, because the electrodes disclosed herein still achieve the desired elevated temperatures.

Furthermore, the assembly of this electrode may be simpler than other solutions. For example, in some conventional systems, a two-part repeller may be used, where the stem is made of a lower conductivity material than the repeller disk. However, these repellers must be assembled. There is no assembly of the electrodes described herein.

With respect to the workpiece holder, the workpiece holder described herein is much easier to assemble than conventional systems, which utilize springs, thermal insulators, movable studs and loose mounting points.

Further, the use of captive features allows thermal expansion to occur with limited stress. In other words, since there is a gap in the interior cavity around the captive feature, the captive feature can expand without contacting the interior cavity. This reduces the thermal stresses that typically occur when hot and cold components are connected together.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece holder for use in an ion implantation system, comprising:
   a platen for holding a workpiece, having an interior cavity in communication with an exterior of the platen through an opening; and
   a captive fastener, having a shaft and a flared head, wherein the flared head is disposed in the interior cavity and a size of the flared head is such that it cannot pass through the opening.

2. The workpiece holder of claim 1, wherein a protruding ring is disposed on the shaft to set a spacing between the platen and a base.

3. The workpiece holder of claim 1, wherein the platen and the captive fastener are constructed of ceramic.

4. The workpiece holder of claim 1, wherein the captive fastener exits the interior cavity perpendicular to a surface of the platen.

5. The workpiece holder of claim 1, further comprising a base, the base having a through hole, through which the shaft of the captive fastener passes and further comprising a retaining nut to affix the shaft to the base.

6. The workpiece holder of claim 5, further comprising spacers surrounding the captive fastener to maintain a separation between the platen and the base.

7. The workpiece holder of claim 1, wherein the captive fastener exits the interior cavity at an angle relative to a surface of the platen, wherein the angle is not perpendicular.

8. The workpiece holder of claim 1, wherein the flared head comprises a cylinder.

* * * * *